(12) United States Patent
Hu et al.

(10) Patent No.: US 10,481,742 B2
(45) Date of Patent: Nov. 19, 2019

(54) MULTI-PHASE TOUCH-SENSING ELECTRONIC DEVICE

(71) Applicant: Touchplus Information Corp., New Taipei (TW)

(72) Inventors: Shih-Hsien Hu, New Taipei (TW); Yi-Feng Wei, New Taipei (TW); Yao-Chih Chuang, Tainan (TW)

(73) Assignee: TOUCHPLUS INFORMATION CORP., New Taipei (TW)

( * ) Notice: Subject to any disclaimer, the term of this patent is extended or adjusted under 35 U.S.C. 154(b) by 8 days.

(21) Appl. No.: 15/835,414

(22) Filed: Dec. 7, 2017

(65) Prior Publication Data

US 2018/0101262 A1 Apr. 12, 2018

Related U.S. Application Data

(63) Continuation-in-part of application No. 14/746,945, filed on Jun. 23, 2015, now abandoned.

(30) Foreign Application Priority Data

Jun. 23, 2014 (TW) .................. 201410282001 A (51) Int. Cl.
*G06F 3/044* (2006.01)
*G06F 3/041* (2006.01)
*G06F 1/16* (2006.01)
*G06F 3/0488* (2013.01)
*G06F 3/01* (2006.01)
(Continued)

(52) U.S. Cl.
CPC ............ *G06F 3/044* (2013.01); *G06F 1/1633* (2013.01); *G06F 1/1692* (2013.01); *G06F 3/014* (2013.01); *G06F 3/0416* (2013.01); *G06F 3/0488* (2013.01); *G06F 3/04886* (2013.01); *H03K 17/9618* (2013.01); *G06F 2203/04101* (2013.01); *G06K 9/0002* (2013.01);
(Continued)

(58) Field of Classification Search
CPC . G06F 3/044; G06F 3/045; G06F 1/16; G06F 3/041; H01H 13/14; G01R 27/26; G06K 9/00; H04M 1/02
See application file for complete search history.

(56) References Cited

U.S. PATENT DOCUMENTS

9,864,241 B1 * 1/2018 Pedder ................ G02F 1/13338
2008/0142352 A1 6/2008 Wright
(Continued)

*Primary Examiner* — Lunyi Lao
*Assistant Examiner* — Johny Lau
(74) *Attorney, Agent, or Firm* — WPAT, PC (57) ABSTRACT

A touch-sensing electronic device includes a housing having first, second and third touch-sensing surfaces; a substrate extensively disposed under the first, second and third touch-sensing surfaces; sensing electrodes formed on the same substrate, and having capacitance changes in response to touch operations or gestures respectively performed on or over the first, second and third touch-sensing surfaces, wherein the sensing electrodes are grouped into three sensing electrode arrays corresponding to the first, second and third touch-sensing surfaces, respectively; and a controller for generating respective control signals corresponding to the touch operations performed on or over the first, second and third touch-sensing surfaces. At least two of the three sensing electrode arrays have different configurations for performing different sensing operations.

16 Claims, 9 Drawing Sheets

(51) Int. Cl.
*H03K 17/96* (2006.01)
*G06K 9/00* (2006.01)

(52) U.S. Cl.
CPC . *H03K 17/962* (2013.01); *H03K 2217/94036* (2013.01); *H03K 2217/94052* (2013.01)

(56) References Cited

U.S. PATENT DOCUMENTS

| | | |
|---|---|---|
| 2008/0197437 A1 | 8/2008 | Sugimoto et al. |
| 2010/0153313 A1 | 6/2010 | Baldwin et al. |
| 2011/0272260 A1* | 11/2011 | Wallace ............... H03K 17/962 200/300 |
| 2012/0105081 A1* | 5/2012 | Shaikh ................ G06K 9/0002 324/686 |
| 2012/0182253 A1* | 7/2012 | Brosnan .............. G06F 3/0416 345/174 |
| 2013/0215075 A1* | 8/2013 | Lee ..................... G06F 3/044 345/174 |
| 2014/0035865 A1 | 2/2014 | Hu |
| 2014/0066124 A1* | 3/2014 | Novet ................. H04M 1/72569 455/556.1 |
| 2014/0078086 A1 | 3/2014 | Bledsoe et al. |
| 2014/0097857 A1 | 4/2014 | Hu |
| 2014/0097885 A1 | 4/2014 | Hu |
| 2015/0022670 A1* | 1/2015 | Gozzini ............... G06K 9/0002 348/187 |

\* cited by examiner

MULTI-PHASE TOUCH-SENSING ELECTRONIC DEVICE

CROSS-REFERENCE TO RELATED APPLICATIONS

The present application is a continuation-in-part application claiming benefit from a pending U.S. Patent Application bearing a Ser. No. 14/746,945 and filed Jun. 23, 2015, contents of which are incorporated herein for reference.

FIELD OF THE INVENTION

The present invention relates to a touch-sensitive electronic device, and more particularly to a touch-sensitive electronic device supporting multi-phase touch-sensing.

BACKGROUND OF THE INVENTION

With the development of interactive electronic devices, particularly portable electronic communication devices, touch-sensing is more and more popular as a human interface. For keeping improving touch-sensing functions and effects under commonly existing structures of electronic devices, development of multi-phase touching-sensing would be one of the solutions.

SUMMARY OF THE INVENTION

Therefore, the present invention provides a touch-sensitive electronic device supporting multi-phase touch-sensing.

A first aspect of the present invention relates to a touch-sensing electronic device, which comprises:
  a housing having a first touch-sensing surface, a second touch-sensing surface and a third touch-sensing surface;
  a substrate extensively disposed under the first touch-sensing surface, the second touch-sensing surface and the third surface;
  a plurality of sensing electrodes formed on the same substrate, and having capacitance changes in response to touch operations or gestures respectively performed on or over the first touch-sensing surface, the second touch-sensing surface and the third touch-sensing surface, wherein the sensing electrodes are grouped into three sensing electrode arrays corresponding to the first, second and third touch-sensing surfaces, respectively; and
  a controller accommodated in the housing for generating respective control signals corresponding to the touch operations performed on or over the first touch-sensing surface, the second touch-sensing surface and/or the third touch-sensing surface,
  wherein at least two of the three sensing electrode arrays have different configurations for performing different sensing operations.

A second aspect of the present invention relates to a touch-sensing electronic device, which comprises:
  a housing having at least a first touch-sensing surface and a second touch-sensing surface;
  a substrate extensively disposed under at least the first touch-sensing surface and the second touch-sensing surface;
  a plurality of sensing electrodes formed on the same substrate, and having capacitance changes in response to touch operations or gestures respectively performed on or over at least the first touch-sensing surface and the second touch-sensing surface, wherein the sensing electrodes are grouped into at least two sensing electrode arrays corresponding to the first and second touch-sensing surfaces, respectively;
  a controller accommodated in the housing for issuing at least two driving voltage signals for driving different sensing control operations in response to the touch operations or gestures respectively performed on or over the first touch-sensing surface and the second touch-sensing surface; and
  at least two driving electrodes electrically connected to each other and further to the controller in series for driving the different sensing control operations, respectively.

A third aspect of the present invention relates to a touch-sensing electronic device, which comprises:
  a housing having at least a first touch-sensing surface and a second touch-sensing surface;
  a flexible substrate bending to extensively disposed under at least the first touch-sensing surface and the second touch-sensing surface;
  a plurality of sensing electrodes formed on the same substrate, and having capacitance changes in response to touch operations or gestures respectively performed on or over at least the first touch-sensing surface and the second touch-sensing surface, wherein the sensing electrodes are grouped into at least two sensing electrode arrays corresponding to the first and second touch-sensing surfaces, respectively;
  a controller accommodated in the housing and disposed on the same substrate as the sensing electrodes for generating respective control signals corresponding to the touch operations or gestures performed on or over the first touch-sensing surface and the second touch-sensing surface,
  wherein the two sensing electrode arrays have different configurations for performing different sensing operations.

BRIEF DESCRIPTION OF THE DRAWINGS

The invention will become more readily apparent to those ordinarily skilled in the art after reviewing the following detailed description and accompanying drawings, in which.

DETAILED DESCRIPTION OF PREFERRED EMBODIMENTS

The invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 1:
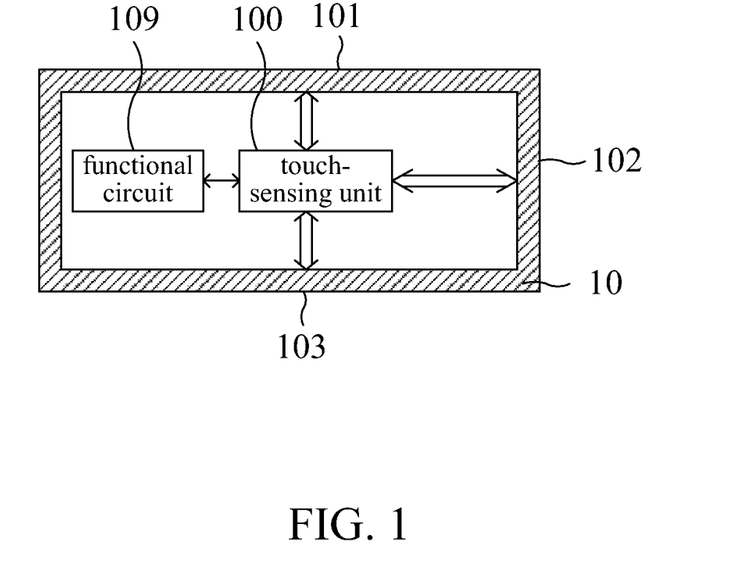
FIG. 1 is schematic diagram illustrating a touch-sensing electronic device supporting multi-phase touch-sensing according to an embodiment of the present invention.

Referring to FIG. 1, a touch-sensing electronic device supporting multi-phase touch-sensing according to an embodiment of the present invention is schematically illustrated. The touch-sensing electronic device includes a housing 10, and conducts multi-phase touch-sensing by way of a first touch-sensing surface 101, a second touch-sensing surface 102 and a third touch-sensing surface 103 of the housing 10. Inside the housing 10, there is a touch-sensing unit 100 and at least one functional circuit 109. The touch-sensing unit 100 detects touch operations on or gestures over one or more of the first touch-sensing surface 101, the second touch-sensing surface 102 and the third touch-sensing surface 103 so as to generate corresponding control signals. The control signals are transmitted to corresponding functional circuit 109 to have the functional circuit 109 conduct associated operations accordingly. For example, the functional circuit 109 may be a main circuit of the electronic device or a circuit of a specific functional module. The specific functional module, for example, may be a light-emitting diode, a speaker, a radio, a timing module such as clock, timer or alarm, a mouse, a project virtual keyboard, a lighting element, a global positioning system (GPS), a game console, a smart phone or a tablet computer, a combination of any two or more of the above-mentioned modules, or any other suitable one which can be integrated with the electronic device and controlled by way of touch-sensing operations. Furthermore, for example, the first touch-sensing surface 101, the second touch-sensing surface 102 and the third touch-sensing surface 103 can be, but are not limited to, top, side and bottom surfaces of the housing 10, respectively.

Figure 6:
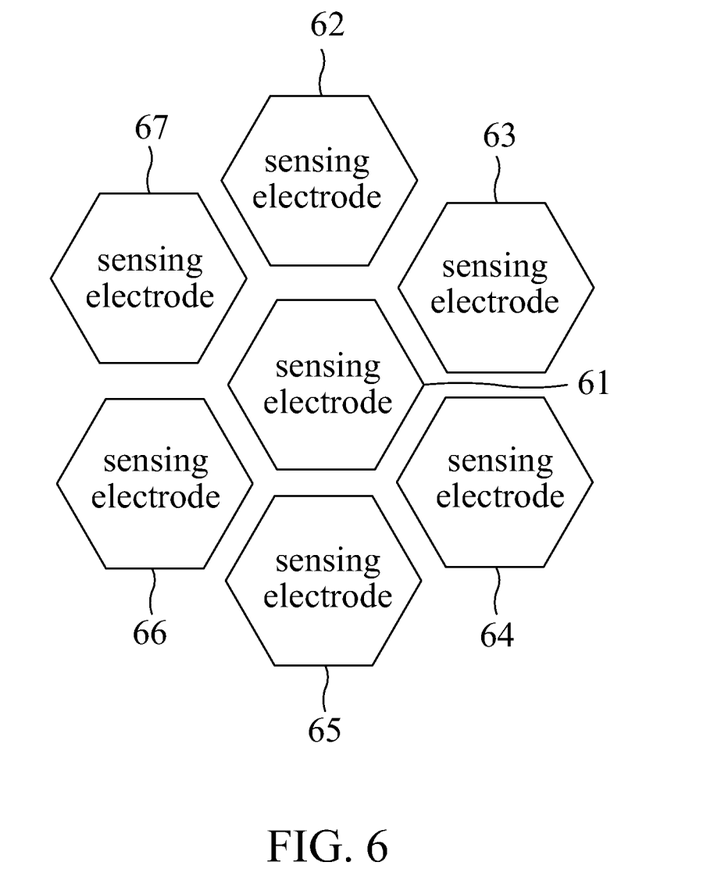
FIG. 6 is an exemplified configuration of a repetitive unit of the sensing electrodes according to an embodiment of the present invention.

It is to be noted that the term "touch-sensitive" or "touch-sensing" means not only to be sensitive to a sliding or touching gesture actually acting on a specified surface but also sensitive to an air gesture floatingly acting over the specified surface. The air gesture may be a vertically moving action and/or a horizontally moving action within a specified range, or a holding-still action for a specified period of time. The horizontally moving action, for example, moves a cursor on the controlled device; the vertically moving action (movement in Z-axis), for example, simulates a pressing operation on a virtual key; and the holding-still action, for example, wakes the touch-sensing electronic device up from a suspension or sleep state. Hereinafter, fingers are exemplified as the tool for executing the gestures. However, any other suitable tool capable of conducting a capacitance change may be used depending on practical requirements and size of the touch-sensing electronic device. For example, palms or conductive objects may also be used instead. For large-area touch sensing, a plurality of touch sensing units may be combined to detect a capacitance change so as to effectively enhance the sensitivity and effective sensible distance. For example, a combination of seven touch sensing electrodes, as illustrated in FIG. 6, would have a larger sensible distance than a combination of three touch sensing units.

The term "multi-phase" used herein indicates a variety of touch-sensing associated conditions such as touch-sensing modes and/or touch-sensing operations. For example and for illustration only, different objectives are controlled through different touch-sensing surfaces with different hands, fingers or objects. The touch-sensing operations may be performed independently on or over different touch-sensing surfaces, or a touch-sensing operation may be performed crossing more than one touch-sensing surface to accomplish one control action.

The terms "top surface", "bottom surface" and "side surface" used herein are defined based on a common operational state. Taking a cell phone which is substantially in a shape of cuboid as an example, the top surface is the surface where information is displayed, the side surface is the surface where button control is performed, and the bottom surface is the surface where a back cover is disposed. In this example, the three surfaces are three contiguous surfaces. Alternatively, the three surfaces may be separate from one another, for example, if the housing is a polyhedron with more surfaces than a cuboid. Furthermore, the first, second and third surfaces may be portions of the same or different surfaces of the housing, where touch-sensing operations are performed with different hands or different fingers. Of course, an electronic device having more than three contiguous or incontiguous touch-sensing surfaces could also support multi-phase touch-sensing according to the present invention.

The touch-sensing functions respectively performed via the first, second and third surfaces, e.g. top, side and bottom surfaces, may be the same or different. Take a smart phone or tablet computer for example. By way of touch actions on or gestures over the top surface, where a display is disposed, common touch-sensing functions can be performed. For example, frame scrolling and/or icon clicking may be executed by touch actions on or gestures over the top surface with either or both thumbs of the user. The keys or buttons conventionally allocated on the side surface for volume and/or zoom effect control can be omitted and replaced with touch-sensing virtual keys and manipulated with either or both index fingers. In spite the omission of physical keys or buttons reduces manufacturing cost and laboring, the physical keys or buttons may still be reserved on the side surface, depending on practical requirement, without affecting the touch-sensing operations. Furthermore, via the bottom surface, page turning and/or cursor shift may be performed with either or both index or middle fingers. It is to be noted that the above examples are just for illustration only, and other function-surface correspondence may be defined.

Figure 2:
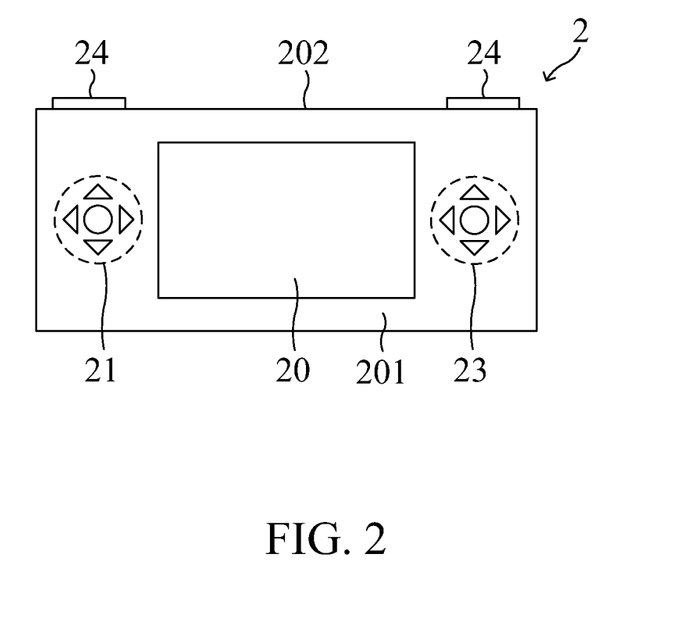
FIG. 2 is a schematic top view of a gaming pad, which is an example of the multi-phase touch-sensing electronic device according to an embodiment of the present invention.

Taking a gaming pad 2 as shown in FIG. 2 as an example, a left directional pad 21, a middle display 20 and a right directional pad 23 on the top surface 201 may serve as three touch-sensing surfaces, on or over which touch-sensing operations are performed with, for example, thumbs of left and/or right hands. If desirable, the side surface 202 where control buttons 24 are disposed may serve as a fourth touch-sensing surface manipulated with, for example, index fingers of left and/or right hands, and the bottom surface (not shown) may serve as a fifth touch-sensing surface, on or over which touch-sensing operations are performed with, for example, index and/or middle fingers of left and/or right hands. In a case that the housing has no definite edges, e.g. is spherically shaped, the three surfaces may be three portions of the rounding surface, which are differentially touch-sensed, or the three surfaces may be defined according to the orientations relative to the user. Since there are diverse examples, it is not to be redundantly described, and hereinafter, the first, second and third surfaces 101, 102 and 103 are specified as the top, side and bottom surfaces of the housing 10 for illustration only. The details about touch-sensing operations over a keypad and associated control methods may refer to a co-pending U.S. patent application Ser. No. 14/594,273. Contents of the application are incorporated herein for reference.

Figure 3:
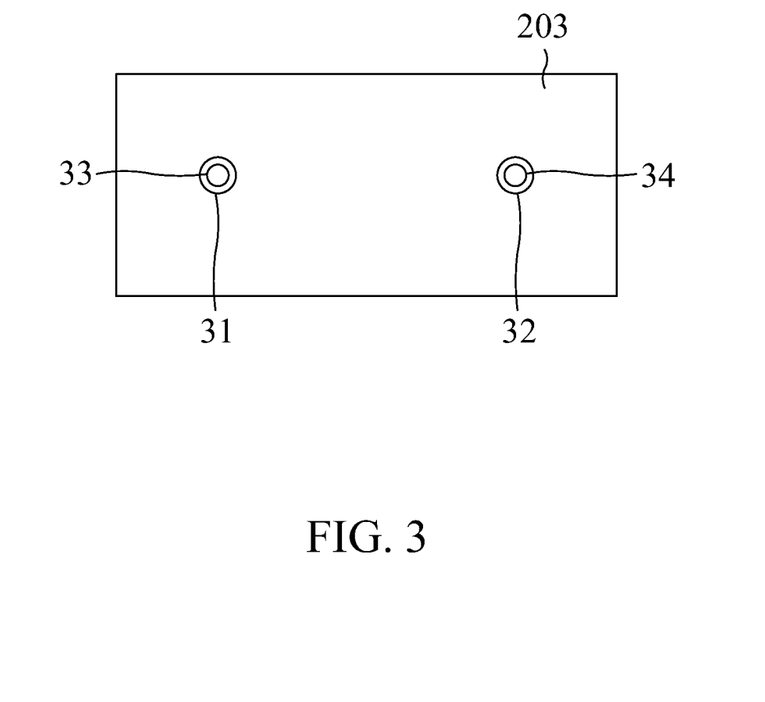
FIG. 3 is a schematic bottom view of the gaming pad shown in FIG. 2.

FIG. 3 schematically illustrates an example of the configuration of the electronic device 2 on the bottom surface 203. As shown, there are two recesses 31 and 32, or bumps, arranged on the bottom surface 203 and used as reference points for touch-sensing operations. Since the user cannot look at the bottom surface 203 to perform touch-sensing operations on or over the bottom surface 203 while using the electronic device, it is desirable, but not essential, to have one or more reference points on the bottom surface 203 so as to facilitate the touch-sensing operations. In a preferred embodiment, optical sensing modules 33 and 34 are disposed in the recesses 31 and 32 or installed in the bumps for image pickup of fingerprints. Accordingly, fingerprint identification may be performed prior to or accompanying the touch-sensing operation.

Figure 4:
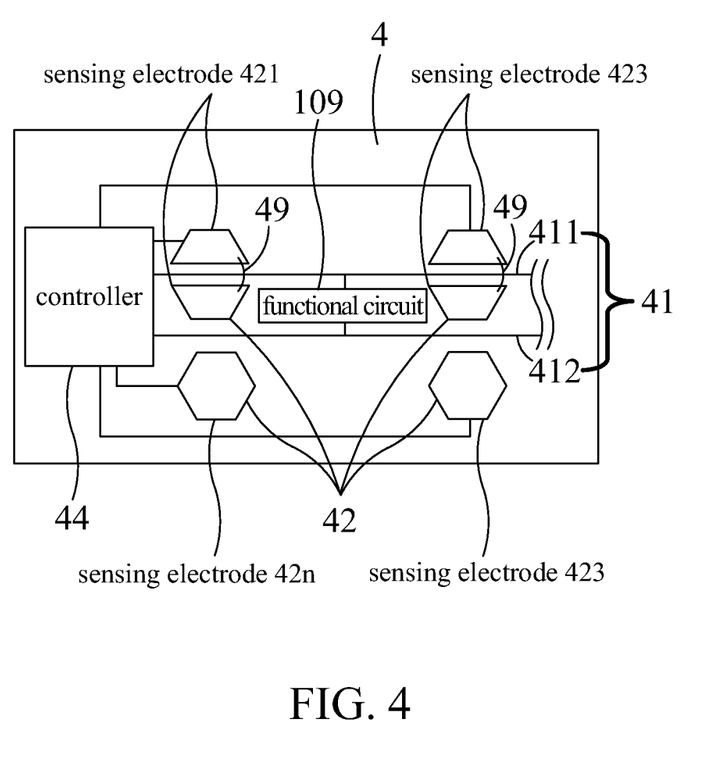
FIG. 4 is schematic circuit block diagram illustrating circuitry disposed on a substrate for touch-sensing according to an embodiment of the present invention.
Figure 5:
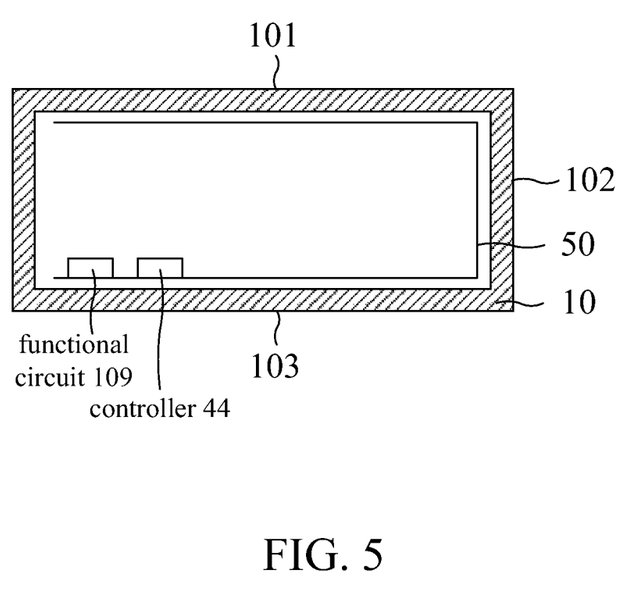
FIG. 5 is a schematic diagram illustrating a flexible substrate disposed in the housing of the electronic device according to an embodiment of the present invention.

For conducting touch-sensing, a touch-sensing unit 100 according to the present invention, as shown in FIG. 1, includes a controller 44 and a sensing electrode circuit 42 including a plurality of sensing electrodes 421~42n, as shown in FIG. 4, typically arranged as one or more arrays for touch-sensing of different touch-sensing surfaces. In an embodiment, the sensing electrode array includes repetitive units, each including six sensing electrodes 62-67 surrounding one sensing electrode 61, as shown in FIG. 6. Although one controller 44 is exemplified above for touch-sensing control of all the three touch-sensing surfaces, more than one controller 44 may be provided for touch-sensing control of respective touch-sensing surfaces. The controller 44, for example, may be an IC chip. The sensing electrodes 421~42n are physically divided into three sensing electrode arrays, e.g. formed on three separate substrates, or virtually divided into three sensing electrode arrays, e.g. formed on the same substrate, for touch-sensing on or over three touch-sensing surfaces, respectively. When the sensing electrodes 421~42n are formed on the same substrate 4, the substrate 4 is preferably flexible to have the three sensing electrode arrays facing corresponding touch-sensing surfaces, respectively. An example of the flexible circuit board 50 serving as the flexible substrate 4, where the sensing electrodes are formed, is shown in FIG. 5. Details will be given in more detail with reference to FIGS. 4~6 hereinafter.

Referring to FIG. 4, a schematic block diagram of circuitry formed on the flexible substrate 4 is illustrated. The substrate 4 may be accommodated in the inner space of the housing 10. In another example, the substrate 4 may be partially or entirely packed by the housing material by way of, for example, injection molding or any other suitable packaging technique, so as to be inserted inside the material of the housing 10. Preferably, the substrate 4 extensively underlies the first, second and third touch-sensing surfaces 101, 102 and 103 to have the sensing electrode arrays distributed corresponding to the three touch-sensing surfaces 101, 102 and 103 for touch-sensing. On the same flexible substrate 4, the functional circuit 109 may be disposed. The substrate 4 may be a single-layer single-face circuit board which is advantageous in low cost and simple manufacturing process. Of course, it can also be a single-layer double-face circuit board, or any other substrate adapted for the above objectives. The circuitry formed on the substrate 4 includes a first conductive structure 41 and a second conductive structure 42 in addition to the controller 44 and the functional circuit 109. In this embodiment, the first conductive structure 41, the second conductive structure 42, the controller 44 and the functional circuit 109 are disposed on the same surface of the substrate 4.

The functional circuit 109 is electrically coupled to the first conductive structure 41 for receiving power, and electrically coupled to the controller 44 for receiving control signals. The second conductive structure 42 includes the sensing electrodes 421~42n mentioned above, which are divided into top sensing electrodes, side sensing electrodes and bottom sensing electrodes, constituting top sensing array, side sensing array and bottom sensing array, respectively. Different touch-sensing operations on or over the top, side and/or bottom surfaces cause capacitance changes of the sensing electrodes so as to generate different sensing signals. In response to the sensing signals obtained from the sensing electrode arrays, the controller 44 outputs the control signals to the function circuit 109 to control corresponding work. The second conductive structure 42 should be electrically isolated from the first conductive structure 41. Therefore, at the intersections of the sensing electrodes 421~42n and the power lines 411 and 412, jumper wires 49 may be used for connecting the sensing electrodes. Alternatively, other suitable means which electrically interconnects the sensing electrodes while electrically isolating the sensing electrodes 421~42n from the power lines 411 and 412 may also be used, or the connecting lines between the sensing electrodes may just bypass the power lines 411 and 412, or the power lines 411 and 412 may bypass the sensing electrodes 421~42n. For example, the jumper wires 49 and the connecting lines to the functional circuit 109 and/or the controller 44 may be provided on the substrate 4 by Surface Mount Technology (SMT) in the same process. If the substrate 4 is a single-layer double-face circuit board, via holes properly arranged may be used for the connecting and isolating purposes.

In prior art, the sensing electrode layer are attached onto the outer surface of a display panel for touch-sensing operations, which is so-called as "out cell". In the above-described embodiment, if the electronic device has an display on any of the first, second and third surfaces 101, 102, 103, the sensing electrodes 421~42n disposed in the inner space of the housing 10 may be attached onto the inner surface of the display panel or integrated into the display panel, which is so-called as "on cell" or "in cell". On the other hand, if the electronic device has no display, or for the surfaces where no display is disposed, the sensing electrodes 421~42n may be attached onto the inner surfaces of the housing 10. In other words, the sensing electrode layer underlies and contacts with the housing portions corresponding to the first, second and third surfaces 101, 102 and 103. Alternatively, taking advantage of the touch-sensing technique previously developed by the inventors, the sensing electrode layer is allowed to have air gaps from the inner surfaces of the housing 10, i.e. from the first, second and third surfaces 101, 102 and 103. Therefore, the sensing electrode layer may be formed on an existing element inside the housing 10 instead of the specific substrate 4. For illustration only, the sensing electrodes 421~42n, as well as the functional circuit 109, may be integrated into the existing circuit board of the electronic device, formed on a battery casing, or attached onto a patch antenna which could be embedded into the back cover of the housing and having a shape consistent to the shapes of the sensing electrodes. In further examples, the controller 44 and/or the functional circuit 109 may be carried by an existing element inside the housing 10 instead of the substrate 4 where the first conductive structure 41 and/or the second conductive structure 42 are disposed, and electrically coupled to the first conductive structure 41 and the second substrate 42 via, for example, a flat cable. FIG. 5 schematically exemplifies a configuration that the controller 44 and the functional circuit 109 are disposed on the flexible circuit board 50, which is bendable inside the housing 10.

In a case that the housing of the electronic device is made of a metallic material, the sensing electrodes covered by the housing would lose sensing capability due to the electrostatic shielding effect. Therefore, in an embodiment, non-metallic material, e.g. plastic material, is inserted into and replaces portions of the housing at positions corresponding to the first, second and/or third touch-sensing surfaces so as to electrostatically expose the touch-sensing electrodes. Accordingly, the touch-sensing operations can be successfully performed. The non-metallic portions may be designed to have specific shapes or contours for decoration or identification purposes. For example, a logo of the product or manufacturer may be shown. If the non-metallic portions are further made transparent or translucent, a light-emitting element such as an LED may be used to brighten the logo, or a visible or invisible light such as an infrared ray may be used to trigger a sounding effect.

FIG. 6 schematically illustrates one of the repetitive units of the sensing electrode array, each six sensing electrodes 62-67 surrounding one sensing electrode 61. The sensing electrodes 61, 62, 63, 64, 65, 66 and 67 are shaped as seven hexagons which are separated from one another. Every two adjacent sensing electrodes are grouped into one sensing pair. The overall capacitance value sensed by one sensing pair and the overall capacitance value sensed by another sensing pair next to the one sensing group are realized and the difference therebetween is calculated. Accordingly, twelve pre-data can be defined. Three calculated data are then obtained by properly processing the twelve pre-data, which represent RGB data of the three primary colors. In other words, in response to the touching action conducted by a palm or one or more fingers of a user or any other suitable touching objects, three-dimensional data can be realized with these sensing electrodes. The controller 44 then outputs a control signal, via the first conductive structure 41, to the functional circuit 109 implemented with the light emitting diodes of three primary colors according to the three-dimensional data. The three-dimensional data can be directly referred to for adjusting the three primary colors, e.g. controlling brightness and/or colors of the functional circuit 109. In another example, the functional circuit 109 is a speaker, and the three-dimensional data can be directly referred to for controlling bass, treble and loudness of the speaker in addition to volume. Furthermore, if the functional circuit 106 is a display, the three-dimensional data can be directly referred to for controlling zooming in/out, rotation angles and brightness instead of only one variable. Alternatively, the seven sensing electrodes shown in FIG. 6 may also be simplified to three sensing electrodes. The sensed three capacitance values can be used to define the three-dimensional data. Another three-dimensional data can also be obtained in response to touch-sensing action on the back surface. For example, the three-dimensional data may be used for mixing light of the light-emitting diodes, mixing sound such as volume, pitch or sound field, photographing control such as zooming in and zooming out, and/or displaying effects of pictures, e.g. zooming in/out and rotation of images.

In addition, the movement track and the coordinate of the touch point detected by the sensing electrodes could be used to input instructions to the graphical user interface to control, for example, a cursor, page-switching or movement in z-axis. In other words, the touch-sensing operation can be conducted not only by the horizontal touching action or gesture on or over the touch-sensing surface but also by the gesture with a vertical shift along z-axis over the touch-sensing surface. Accordingly, the function like a virtual key can be performed. Furthermore, the overall capacitance variation sensed by the plurality of sensing electrodes allows a relatively long sensible distance of the touch-sensing device relative to the user's finger or palm or the conductive object so as to facilitate non-contact touch sensing. The effective sensible distance varies with the amount of the sensing electrodes. For example, a sensing unit with seven sensing electrodes would have more significant capacitance variation and longer sensible distance above the touch-sensing surface than a sensing unit with only three sensing electrodes. The details of other grouping effects may refer to a co-pending US Patent Application Publication Nos. 2014/0035865 A1 and 2014/0097885 A1. Contents of the applications are incorporated herein for reference.

On the other hand, the sensible distance over the touch-sensing surface would be affected by the area of the sensing electrodes on the touch-sensing surface, and vice versa, affect the optimal area of the touch-sensing surface. Furthermore, by sensing the vertical movement of the finger, palm or conductive object over the touch-sensing surface at different time points, a scanning effect similar to the scanning effect horizontally performed on the touch-sensing surface can be obtained. If the vertical movement of the finger, palm or conductive object toward the touch-sensing surface is to simulate the operation of clicking on an icon, the image of the icon starts to visibly change, e.g. bend or distort, once the distance between the finger, palm or conductive object and the icon is decreased to a threshold value. If the distance is further decreased to a preset ratio to the threshold value, e.g. 50%, the image of the icon may be subjected to an animation effect, e.g. explosion, to represent the successful actuation.

In an extensive embodiment, the touch-sensing result on or over the touch-sensing surfaces can be used to determine how the electronic device is used. For example, when simultaneous touch-sensing actions on or over two or more touch-sensing surfaces are detected, a gripping gesture can be determined. That is, a user is gripping the electronic device. Meanwhile, a gripping pattern can also be detected to determine what the user is using the electronic device for. For example, when the electronic device is a smart phone, a gripping pattern showing that the smart phone is gripped by the user with a palm could mean that the user is watching or listening to the smart phone. On the other hand, a gripping pattern showing that the smart phone is gripped by the user with fingers could mean that the user is conducting payment with the smart phone.

Since the touch-sensing unit 100 is capable of performing non-contact touch-sensing in addition to conventional contact touch-sensing, the touch-sensing operations may be performed with or without an air gap from touch-sensing surface, e.g. the first touch-sensing surface 101, the second touch-sensing surface 102 or the third touch-sensing surface 103. Moreover, since an additional parameter such as gripping gesture and/or gripping pattern can be used to realize the operational condition of the electronic device, respective functions can be executed with similar touch-sensing operations under different operational conditions so as to be advantageous in design flexibility.

Figure 7:
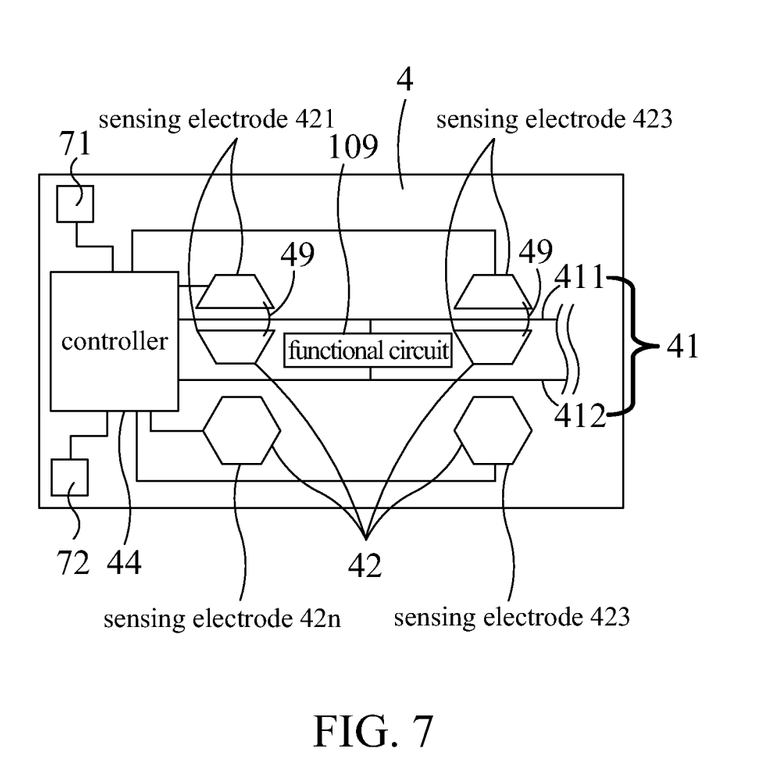
FIG. 7 is schematic circuit block diagram illustrating circuitry disposed on a substrate for touch-sensing according to another embodiment of the present invention, wherein an operational state sensor is provided for detecting the operational state of the electronic device.

In another extensive embodiment, as shown in FIG. 7, an attitude sensor 71, e.g. a G-sensor or a gyroscope, a thermo-sensor 72, e.g. a thermistor, and/or any other suitable sensing element can be used with the touch-sensing unit of the present invention. The attitude sensor 71 and the thermo-sensor 72 are electrically coupled to the controller 44. The controller 44 combines the resistance or capacitance change of the attitude sensor 71 resulting from the attitude change of the electronic device and/or the resistance or capacitance change of the thermo-sensor 72 resulting from the environmental temperature change with the touch-sensing result on or over the first, second and third touch-sensing surfaces into a set of control instructions, which can be used to provide diversified interfaces and functions. For example, assume the electronic device includes a headphone/speaker dual-functional element. If the attitude sensor 71 included in the electronic device detects that the electronic device is placed on a supporting plane, the controller 44 controls the headphone/speaker dual-functional element to function as a speaker. Accordingly, the speaker in the functional circuit 109 is controlled within a first volume range. On the other hand, if the attitude sensor 71 detects an attitude change and determines it is the headphone working, it is changed to a second volume range. The second volume range overlaps with the lower part of the first volume range. The volume can be tuned by a touch-sensing operation corresponding to volume adjustment on or over the touch-sensing surface. In addition to controlling volume, the sensing result of the attitude sensor 71 may also be used to control sound features like direction, field, quality or pitch. In another example, the electronic device is a musical instrument or a toy. The attitude sensing result shows the operational condition of the electronic device, and touch-sensing operations corresponding to the operational condition are performed to control functions of the electronic device, e.g. quality, volume or pitch of sound.

In a further extensive embodiment, the electronic device is a sports ring integrated therewith the attitude sensor 71 and the thermo-sensor 72. In response to the sports conditions, the controller 44 combines the resistance or capacitance change of the attitude sensor 71 resulting from the attitude change of the electronic device and/or the resistance or capacitance change of the thermo-sensor 72 resulting from the environmental temperature change with the touch-sensing result on or over the first, second and third touch-sensing surfaces into a set of control instructions, which can be used to provide diversified interfaces and functions for the sports ring. For example, the sports ring may exhibit functions of monitoring body-temperature or calculating consumed calories, and a touch-sensing input interface may be provided for the sports ring.

By way of the present invention, touch-sensing operations can be done through three surfaces of the electronic device, so more and more touch-sensing functions can be conducted. The touch-sensing functions can be further improved and diversified by detecting the operational state of the electronic device and adding a parameter indicative of the operational state into the control signals. Accordingly, the control signals could be defined in more ways.

Furthermore, if the three touch-sensing surfaces are reachable by three fingers of one hand, a single hand can control multiple touch-sensing phases conventionally achieved by both hands. In addition, the conventional physical side keys or buttons can be omitted to reduce cost and laboring.

Figure 8:
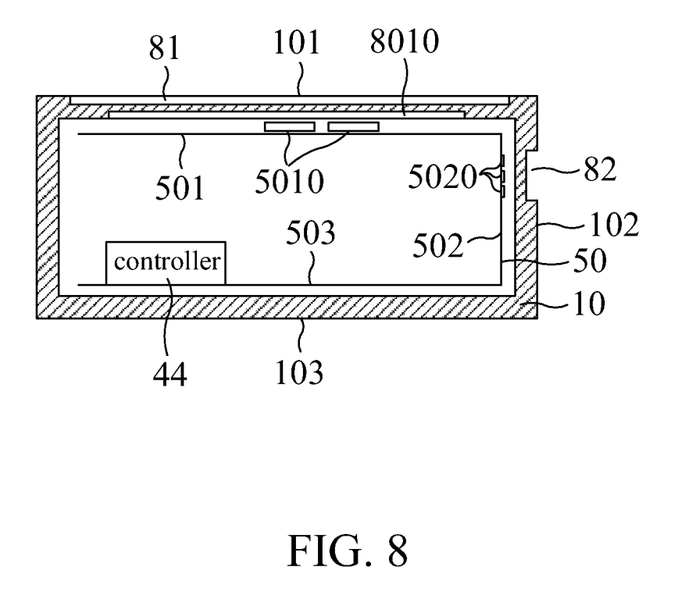
FIG. 8 is a schematic diagram illustrating a touch-sensing electronic device supporting multi-phase touch-sensing according to another embodiment of the present invention.

Referring to FIG. 8, a touch-sensing electronic device supporting multi-phase touch-sensing according to another embodiment of the present invention is schematically illustrated. Similar to the embodiment of the touch-sensing electronic device as illustrated in FIG. 1, the touch-sensing electronic device includes a housing 10, and conducts multi-phase touch-sensing by way of a first touch-sensing surface 101, a second touch-sensing surface 102 and a third touch-sensing surface 103 of the housing 10. Inside the housing 10, a controller 44 is disposed. In response to touch operations on or gestures over one or more of the first touch-sensing surface 101, the second touch-sensing surface 102 and the third touch-sensing surface 103, corresponding operations are conducted accordingly. For example, a press-sensing operation is performed in response to a pressing operation on the first touch-sensing surface 101, a fingerprint-sensing operation is performed in response to a touch operation on the second touch-sensing surface 102, and a touch-sensing operation is performed in response to a touch operation on or gestures over the third touch-sensing surface 103. The controller 44 in this embodiment may be carried by an existing element (not shown) inside the housing 10 or the substrate 4 where the first conductive structure 41 and/or the second conductive structure 42 are disposed, and electrically coupled to the first conductive structure 41 and the second substrate 42 via, for example, a flat cable, as illustrated in FIG. 4. The controller 44 in this embodiment may be disposed on the flexible circuit board 50, which is bendable inside the housing 10, as illustrated in FIG. 5. The first conductive structure 41, the second substrate 42 and the controller 44 may be disposed on the same face of the flexible circuit board 50, e.g. the outward face. Alternatively, they may be disposed on different surfaces of the flexible circuit board 50, e.g. some on inward surface and the others on the outward face. The second conductive structure 42 may be configured as illustrated in FIG. 6. This embodiment of touch-sensing electronic device will be described in more detail hereinafter.

As shown in FIG. 8, the touch-sensing electronic device includes a planar display module 81, which is disposed at the first touch-sensing surface 101, and one or more ground electrodes 8010, which are disposed between the planar display module 81 and a first group of sensing electrodes 5010. The first group of sensing electrodes 5010 is disposed in a first zone 501 of the flexible circuit board 50. The one or more ground electrodes 8010 receive a constant voltage, e.g. 0 volt or a constant positive or negative level. In response to a pressing operation conducted by a user on the first touch-sensing surface 101, one or more of the ground electrodes 8010 are pushed toward corresponding sensing electrodes 5010 so that a distance between the ground electrodes 8010 and the sensing electrodes 5010 is changed. The controller 44 then executes a control action corresponding to the capacitance change resulting from the distance change. More details of press sensing are exemplified in U.S. Pat. Nos. 8,912,930 and 9,638,731, whose contents are incorporated herein for reference. In this embodiment, the ground electrodes 8010 are provided independent from the planar display module 81. Alternatively, the ground electrodes 8010 may also be integrated into the planar display module 81 on condition that the capacitive coupling between the ground electrodes 8010 and the sensing electrodes 5010 would not be interfered by any other conductive member existing in the planar display module 81.

Furthermore, the touch-sensing electronic device includes a second group of sensing electrodes 5020 disposed in a second zone 502 of the flexible circuit board 50. For accurately identifying fingerprint, the sensing electrodes 5020 in the second zone 502 are made smaller and allocated more densely than in general touch-sensing area for higher resolution. In this way, the controller 44 can readily detect and identify the fingerprint to verify the user. The fingerprint sensing, for example, can be conducted by a sensing method described in U.S. Pat. No. 9,430,103, whose contents are incorporated herein for reference. In the embodiment as shown in FIG. 8, a recess 82 is formed on the second touch-sensing surface 102. The recess 82 thins the wall of the housing in the second zone and thus shortens the distance between the finger and the sensing electrodes 5020 so as to further improve the sensing precision. In addition, the recess 82 can be used for guiding the user's finger into the second zone 502. Of course, a recess may be alternatively or additionally formed in an inner surface of the wall opposite to the second touch-sensing surface 102 to achieve similar precision-enhancing purpose. If necessary, a mark in any proper form rather than a recess may be provided on the second touch-sensing surface 102 for prompting the position of the fingerprint-sensing area while keeping the wall of the housing flat. Furthermore, since the sensing electrodes 5020 are formed on the flexible circuit board 50, which is bendable to conform with the curvature of the housing 10, the sensing electrodes 5020 can thus be made close to the surface where the finger touches. Therefore, the sensitivity and precision of fingerprint sensing can be improved.

The touch-sensing electronic device further includes a third group of sensing electrodes (not shown) disposed in a third zone 503 of the flexible circuit board 50. The third group of sensing electrodes perform touch-sensing operations as exemplified and described in the above embodiments with reference to FIG. 1 through FIG. 7, and are not to be repeated herein. According to practical requirements, the third group of sensing electrodes may extend to the second touch-sensing surface and/or the first touch-sensing surface and/or more other surfaces so that touch-sensing operations described in the above embodiments with reference to FIG. 1 through FIG. 7 can be performed in more than the third touch-sensing surface.

It is understood from the above-described embodiment that the first, second and third group of sensing electrodes may be formed on the same flexible circuit board by way of the same manufacturing process, and support different functions of the touch-sensing electronic device. Taking a smart phone as an example of the touch-sensing electronic device, the first group of sensing electrodes support press sensing of the planar display module on the top surface of the smart phone so that press feeling can be provided while inputting information or command to improve experience of use. For example, the HOME key can be implemented with press sensing, or the 3D touch function developed by Apple Inc. can be executed with the first group of sensing electrodes. On one or more side surfaces of the smart phone, the second group of sensing electrodes are disposed and support fingerprint sensing. While the user is holding the smart phone with his palm, his thumb would rest on the fingerprint-sensing area, i.e. the second zone, spontaneously, to conduct fingerprint identification. Once being verified, the user can, for example, conduct mobile payment, proximately unlock electronic lock, or manipulate the smart phone to perform different functions with touch/press/gesture operations on designated surfaces. For example, scrolling up or down can be performed on the bottom surface of the smart phone.

It is to be noted that the surfaces of the smart phone for press-sensing, fingerprint-sensing and touch-sensing can be rearranged. For example, the fingerprint sensing can be conducted on the bottom surface, the, the press sensing can be conducted on the side surface, and the touch sensing can be conducted on the top surface and/or extensively the side and bottom surfaces.

Figure 9:
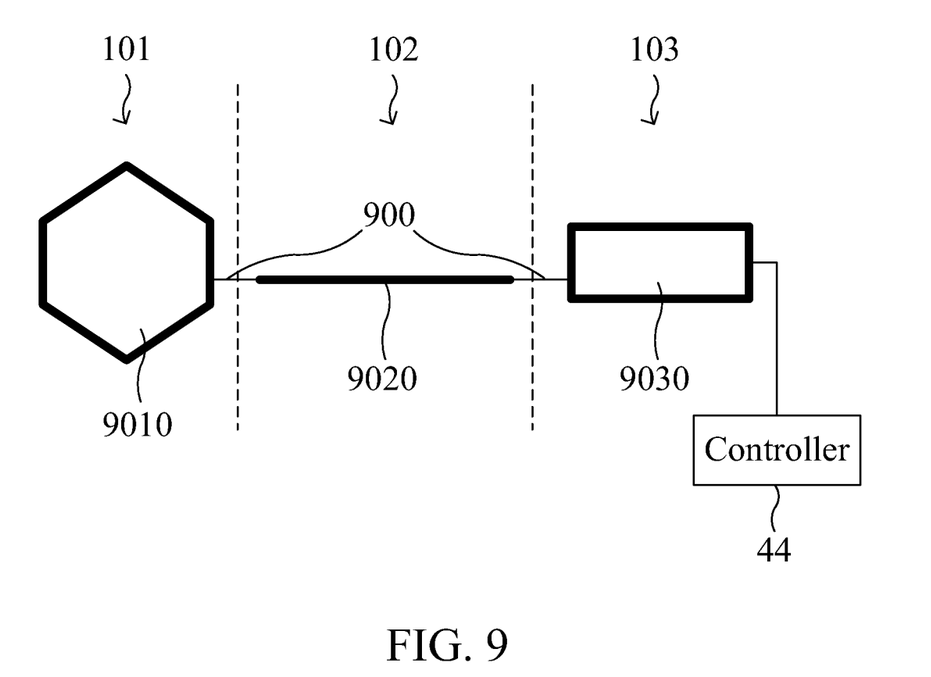
FIG. 9 is a schematic diagram illustrating electric connection of the driving electrodes respectively supporting the multi-phase touch-sensing as illustrated in FIG. 8.

Please refer to FIG. 9, in which driving electrodes applicable to the embodiment of FIG. 8 are schematically illustrated. The driving electrodes 9010 function as the ground electrodes 8010 as shown in FIG. 8 for driving press sensing on the first touch-sensing surface 101. The driving electrodes 9020 function for driving fingerprint sensing on the second touch-sensing surface 102. The driving electrodes 9030 function for driving touch sensing on the third touch-sensing surface 103. The shapes of the driving electrodes 9010, 9020 and 9030 shown in FIG. 9 do not intend to limit the practical shapes of the driving electrodes, but are only for schematically indicating area relations among the three driving electrodes. For example, the press sensing is driven with driving electrodes having large area, the fingerprint sensing is driven with driving electrodes having smaller line width and line spacing, and the touch sensing is driven with driving electrodes having medium area and line width and spacing. As shown in FIG. 9, three driving electrodes 9010, 9020 and 9030 are electrically connected to each other and further to the controller 44 in series via a conductive wire 900. In this way, the three driving electrodes can share a common driving pin of the controller 44, thereby saving chip pins of the controller, and the controller 44 can be coupled thereto a plurality of series of driving electrodes 9010, 9020 and 9030.

In an embodiment, the controller 44 issue respective driving voltage signals to the driving electrodes in a time-division multiplexing manner. In other words, the driving voltage signals are transmitted to the driving electrodes in turn. For example, the driving voltage signal required by the driving electrodes 9010 is issued in a first duration of time while conducting the press sensing operation; the driving voltage signal required by the driving electrodes 9020 is issued in a second duration of time after the first duration of time while conducting the fingerprint sensing operation; and the driving voltage signal required by the driving electrodes 9030 is issued in a third duration of time after the second duration of time while conducting the touch sensing operation. Thus the three functions can be performed in sequence. In an embodiment, the driving voltage signal required by the driving electrodes 9010 for press sensing is a constant voltage signal. The driving voltage signal required by the driving electrodes 9020 for fingerprint sensing is the charging/discharging voltage signal as described in U.S. Pat. No. 9,430,103, whose contents are incorporated herein for reference. The driving voltage signal required by the driving electrodes 9030 for touch sensing may be any of the voltage signals commonly used for capacitive touch-sensing, and is not to be redundantly described herein.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A touch-sensing electronic device, comprising:
a housing having a first touch-sensing surface, a second touch-sensing surface and a third touch-sensing surface;
a substrate extensively disposed under the first touch-sensing surface, the second touch-sensing surface and the third surface;
a plurality of sensing electrodes formed on the same substrate, and having capacitance changes in response to touch operations or gestures respectively performed on or over the first touch-sensing surface, the second touch-sensing surface and the third touch-sensing surface, wherein the sensing electrodes are grouped into three sensing electrode arrays corresponding to the first, second and third touch-sensing surfaces, respectively;
three driving electrodes for respectively driving sensing control operations of the three sensing electrode arrays to sense the capacitance changes in response to respective driving voltage signals;
and
a controller accommodated in the housing for issuing the respective driving voltage signals to the three driving electrodes and generating respective control signals corresponding to the sensed capacitance changes,
wherein the three driving electrodes are electrically connected in series to the controller via a same conductive wire, and the respective driving voltage signals for respectively driving the sensing control operations of the three sensing electrode arrays are sequentially transmitted from the controller to the three driving electrodes via the same conductive wire, and
wherein at least two of the three sensing electrode arrays have different configurations for performing different sensing operations,
a planar display module on the first touch-sensing surface, and a ground electrode, which is disposed between the planar display module and the sensing electrode array corresponding to the first touch-sensing surface,
wherein the ground electrode receives a constant voltage signal as one of the driving voltage signals from the controller, and is movable toward the corresponding sensing electrode array in response to a pressing operation so as to change a distance therefrom to the corresponding sensing electrode array for press sensing,
wherein the sensing electrode array corresponding to the second touch-sensing surface receives a charging/discharging voltage signal as one of the driving voltage signals from the controller in response to a touch operation on the second touch-sensing surface for fingerprint sensing.

2. The touch-sensing electronic device according to claim 1, wherein the first touch-sensing surface is a top surface of the housing, the second touch-sensing surface is a side surface of the housing, and the third touch-sensing surface is a bottom surface of the housing, the substrate is disposed in the housing or partially or entirely packed by the housing material, and there is an air gap between a surface of the substrate and at least one of the first, second and third touch-sensing surfaces of the housing.

3. The touch-sensing electronic device according to claim 1, wherein the driving voltage signals are different for driving the touch-sensing operations of the sensing electrode arrays having different configurations for performing different sensing operations.

4. The touch-sensing electronic device according to claim 1, wherein the sensing electrode array corresponding to the third touch-sensing surface receives a charging/discharging voltage signal as one of the driving voltage signals from the controller in response to a touch operation on or a gesture over the third touch-sensing surface for touch sensing.

5. The touch-sensing electronic device according to claim 1, wherein the substrate is made of a flexible material and bent to have the three sensing electrode arrays facing the first, second and third touch-sensing surfaces, respectively.

6. The touch-sensing electronic device according to claim 1, wherein the different sensing operations are a press sensing operation, a fingerprint sensing operation and a touch sensing operation.

7. The touch-sensing electronic device according to claim 6, wherein the sensing electrode array for the fingerprint sensing operation is configured to have a smaller line width and line spacing than the sensing electrode array for the press sensing operation.

8. The touch-sensing electronic device according to claim 6, wherein a wall of the housing having the touch-sensing surface for the fingerprint sensing operation is thinned to improve sensitivity and sensing precision.

9. A touch-sensing electronic device, comprising:
a housing having at least a first touch-sensing surface and a second touch-sensing surface; a substrate extensively disposed under at least the first touch-sensing surface and the second touch-sensing surface;
a plurality of sensing electrodes formed on the same substrate, and having capacitance changes in response to touch operations or gestures respectively performed on or over at least the first touch-sensing surface and the second touch-sensing surface, wherein the sensing electrodes are grouped into at least two sensing electrode arrays corresponding to the first and second touch-sensing surfaces, respectively;
at least two driving electrodes for respectively driving at least two different sensing control operations of the at least two sensing electrode arrays to sense the capacitance changes in response to at least two different driving voltage signals; and
a controller accommodated in the housing for issuing the at least two different driving voltage signals to the at least two driving electrodes,
wherein the at least two driving electrodes are electrically connected in series to the controller via a same conductive wire, and the at least two different driving voltage signals for respectively driving the at least two different sensing control operations of the at least two sensing electrode arrays are sequentially transmitted from the controller to the at least two driving electrodes via the same conductive wire,
a planar display module on the first touch-sensing surface, and one of the at least two driving electrodes functions as a ground electrode, which is disposed between the planar display module and the sensing electrode array corresponding to the first touch-sensing surface,
wherein the ground electrode receives a constant voltage signal as one of the driving voltage signals from the controller, and is movable toward the corresponding sensing electrode array in response to a pressing operation so as to change a distance therefrom to the corresponding sensing electrode array for press sensing,
wherein the sensing electrode array corresponding to the second touch-sensing surface receives a charging/discharging voltage signal as one of the driving voltage signals from the controller in response to a touch operation on the second touch-sensing surface for fingerprint sensing.

10. The touch-sensing electronic device according to claim 9, wherein the first and second touch-sensing surfaces are two of top, side and bottom surfaces of the housing, and the substrate is disposed in the housing or partially or entirely packed by the housing material.

11. The touch-sensing electronic device according to claim 9, wherein the housing further comprises a third touch-sensing surface, and the sensing electrodes are grouped into three sensing electrode arrays corresponding to the first, second and third touch-sensing surfaces, respectively, and have different configurations for performing different sensing control operations.

12. The touch-sensing electronic device according to claim 9, wherein the substrate is made of a flexible material and bent to have the at least two sensing electrode arrays facing the first and second touch-sensing surfaces, respectively.

13. The touch-sensing electronic device according to claim 9, wherein the sensing electrode array corresponding to the second touch-sensing surface receives a charging/discharging voltage signal as one of the driving voltage signals from the controller in response to a touch operation on or a gesture over the third touch-sensing surface for touch sensing.

14. The touch-sensing electronic device according to claim 9, wherein the different sensing operations are a press sensing operation, a fingerprint sensing operation and a touch sensing operation.

15. The touch-sensing electronic device according to claim 14, wherein the sensing electrode array for the fingerprint sensing operation is configured to have a smaller line width and line spacing than the sensing electrode array for the press sensing operation.

16. The touch-sensing electronic device according to claim 14, wherein a wall of the housing having the touch-sensing surface for the fingerprint sensing operation is thinned to improve sensitivity and sensing precision.

* * * * *